United States Patent [19]

Kenji

[11] Patent Number: 4,509,101
[45] Date of Patent: Apr. 2, 1985

[54] PROTECTION CIRCUIT FOR SWITCHING POWER AMPLIFIER

[75] Inventor: Yokoyama Kenji, Hamamatsu, Japan

[73] Assignee: Nippon Gakki Seizo Kabushiki Kaisha, Hamamatsu, Japan

[21] Appl. No.: 522,989

[22] Filed: Aug. 15, 1983

[30] Foreign Application Priority Data

Sep. 28, 1982 [JP] Japan ............................ 57-146759[U]

[51] Int. Cl.$^3$ ............................................. H02H 7/20
[52] U.S. Cl. ....................................... 361/79; 361/98; 330/207 P; 330/10
[58] Field of Search ................... 361/79, 100, 101, 78, 361/98; 330/298, 207 P, 10

[56] References Cited

U.S. PATENT DOCUMENTS

| | | | |
|---|---|---|---|
| 3,904,979 | 9/1975 | Suzuki | 361/79 X |
| 4,173,739 | 11/1979 | Yoshida | 361/79 X |
| 4,216,517 | 8/1980 | Takahashi | 361/79 |
| 4,355,341 | 10/1982 | Kaplan | 361/79 |

Primary Examiner—Patrick R. Salce
Attorney, Agent, or Firm—Spensley, Horn, Jubas & Lubitz

[57] ABSTRACT

A protection circuit for a switching power amplifier comprises a first detection circuit which detects a current flowing through an output stage switching circuit, a second detection circuit which detects an output voltage of the output stage switching circuit, and an amplitude limitation circuit which limits the amplitude of an input signal to the output stage switching circuit in accordance with both the first and second detection. Thus the switching circuit is surely protected from destruction.

3 Claims, 3 Drawing Figures

PROTECTION CIRCUIT FOR SWITCHING POWER AMPLIFIER

BACKGROUND OF THE INVENTION

1. Field of the Invention

This invention relates to a protection circuit for a switching power amplifier, and more particularly, to a protection circuit for protecting the output stage switching circuit from the destruction due to the overload condition thereof.

2. Description of the Prior Art

Recently, as power amplifiers for an audio signal with high power efficiency characteristics, switching power amplifiers such as power amplifiers using pulse-width modulation technique have been presented.

For a protection circuit for preventing an output stage switching circuit of the power amplifier from falling into the overload condition, there has been conventionally known such one as shown in FIG. 1, for example. FIG. 1 as a whole shows a power amplifier having such protection circuit. In the amplifier shown in FIG. 1, bias voltage sources 1a and 1b, resistors 2a and 2b and power field effect transistors (hereinafter referred to as power FET) 3a and 3b constitute an output stage switching circuit 5 for push-pull amplifying a pulse signal em which is pulse-width modulated in accordance with a signal to be amplified and is applied to a terminal 4. An output pulse signal eo derived from a connection point between collectors of the power FET's is demodulated by a low-pass filter 8 having an inductor 6 and a capacitor 7 into an analogue signal and is applied to a loudspeaker (load) 9.

Resistors 10a and 10b and transistors 11a and 11b constitute a protection circuit of the output stage switching circuit 5, and function so that the resistors 10a and 10b detect the respective drain currents of the power FET's 3a and 3b and that the transistors 11a and 11b become conductive based on the respective voltages across the resistors 10a and 10b when each of the drain currents of the power FET's 3a and 3b exceeds a predetermined magnitude, with the result that the drain currents of the power FET's 3a and 3b are limited not to increase beyond the predetermined magnitude.

The above-mentioned protection circuit, however, requires the use of transistors with high speed switching function as the transistors 11a and 11b, thereby increasing manufacturing cost. In addition, since the loudspeaker 9 with reactance is usually used as a load, it is possible that each of the drain-source voltages ($V_{DS}$) of the power FET's 3a and 3b becomes greater than the power supply voltage Vc. Accordingly, it is necessary to set the limitation voltage level to which the drain current levels of the power FET's are limited smaller than the limitation voltage level which is determined based on the power supply voltage Vc when the load has no reactance. The power amplifier above, therefore, is not able to derive a high output power by effectively utilizing the maximum output powers of the power FET's 3a and 3b as much as possible.

SUMMARY OF THE INVENTION

It is an object of this invention to provide a protection circuit for switching power amplifier which eliminates the needs for expensive transistors with high speed switching function.

Another object of this invention is to provide a protection circuit for switching power amplifier which can derive a large output power from an output stage switching circuit efficiently.

A further object of this invention is to provide a protection circuit for switching power amplifier which can surely protect the amplifier from a destruction thereof when an output current increases greatly.

Yet another object of this invention is to provide a protection circuit for switching power amplifier which can also surely protect the amplifier even if an impedance of a load is lowered greatly.

In a preferred embodiment of this invention which will be described hereinunder in detail, a protection circuit for a switching power amplifier comprises detection circuit means which detects a current flowing through output stage switching circuit means and outputs a detection signal, and an amplitude of an input signal of the amplifier is limited based on both the output signal of the output stage switching circuit means and the detection signal.

The foregoing objects and other objects as well as the characteristic features of the invention will become more apparent and more readily understandable by the following description and the appended claims when read in conjunction with the accompanying drawings.

DETAILED DESCRIPTION OF THE PREFERRED EMBODIMENT

Figure 1:
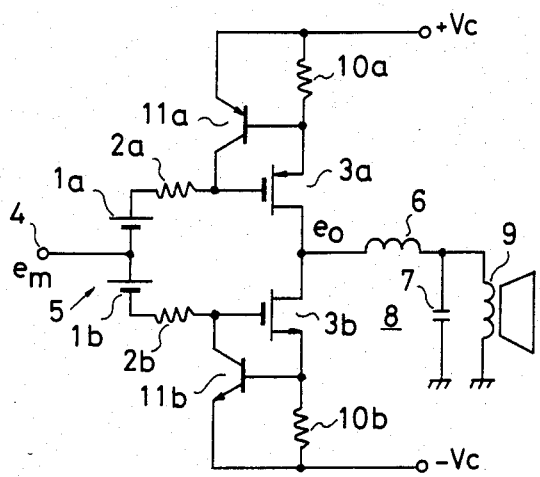
FIG. 1 is a schematic circuit diagram of a switching power amplifier having a prior art protection circuit.
Figure 2:
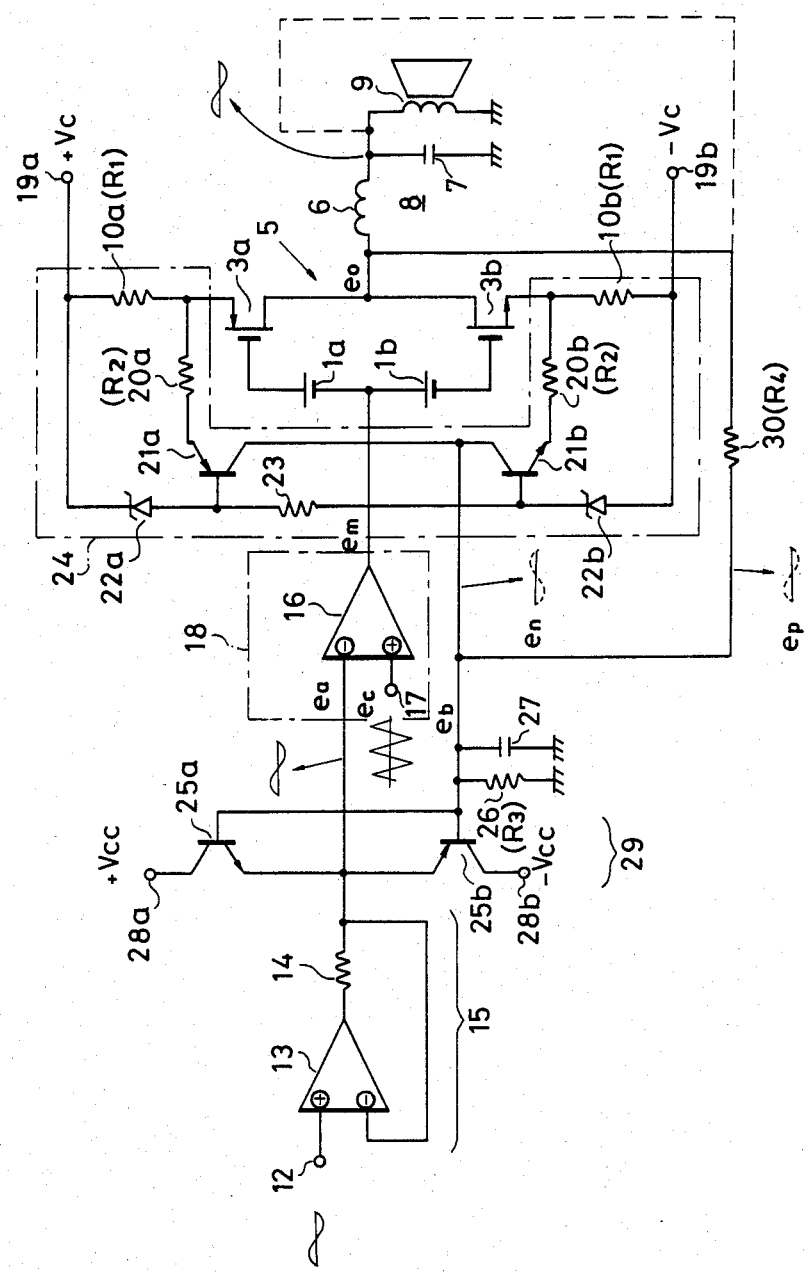
FIG. 2 is a circuit diagram of a switching power amplifier having a protection circuit of the preferred embodiment of the invention.

Referring now to FIG. 2, there will be described a circuit diagram of a switching power amplifier having a protection circuit of the preferred embodiment of this invention. The amplifier shown in FIG. 2 is a pulse width modulation amplifier and is subject to an amplification of an audio signal, and same parts thereof as those shown in FIG. 1 are represented by same reference numerals and symbols and description of these parts is omitted.

In FIG. 2, reference numeral 12 designates an input terminal which is applied with an input signal (audio signal) to be amplified, and the input terminal 12 is connected to a non-inverting input terminal of an amplifier 13. An output terminal of the amplifier 13 is connected to one terminal of a resistor 14, and an inverting input terminal of the amplifier 13 is connected to the other terminal of the resistor 14. The amplifier 13 and the resistor 14 constitute a buffer amplifier 15 which amplifies the input signal with a unity gain (1).

The other terminal of the resistor 14 is connected to an inverting input terminal of a comparator 16, and a non-inverting input terminal of the comparator 16 is connected to a terminal 17 which is applied with a carrier signal ec having a triangular waveshape and a constant frequency sufficiently larger than a possible maximum frequency of an input signal ea at the inverting input terminal of the comparator 16. The comparator 16 functions as a pulse-width modulation circuit 18 outputting a pulse signal em which has a same frequency as that of the carrier signal ec and has a duty ratio proportional to an amplitude of the input signal ea.

An output terminal of the comparator 16 is connected to gate electrodes of power FET's 3a and 3b via bias voltage sources 1a and 1b, respectively. The power FET's 3a and 3b and the bias voltage sources 1a and 1b function as an output stage switching circuit 5 amplifying the pulse signal em and outputting an output signal eo from commonly connected drain electrodes of the power FET's 3a and 3b.

A source electrode of the power FET 3a is connected to a positive power supply terminal 19a via a current detecting resistor 10a (resistance value: R1) and to an emitter electrode of a PNP transistor 21a via a resistor 20a (resistance value: R2), the positive power supply terminal 19a being applied with a positive voltage +Vc. On the other hand, a source electrode of the power FET 3b is connected to a negative power supply terminal 19b via a current detecting resistor 10b (resistance value: R1) and to an emitter electrode of an NPN transistor 21b via a resistor 20b (resistance value: R2), the negative power supply terminal 19b being applied with a negative voltage −Vc. Between the positive power supply terminal 19a and a base electrode of the transistor 21a is connected a Zener diode 22a (Zener voltage: Vz), while a Zener diode 22b (Zener voltage: Vz) is connected between the negative power supply terminal 19b and a base electrode of the transistor 21b. Between the base electrodes of the transistors 21a and 21b is connected a resistor 23, and collector electrodes of the transistors 21a and 21b are commonly connected together. The resistors 10a, 10b, 20a, 20b and 23, the Zener diodes 22a and 22b and the transistors 21a and 21b constitute a current detection circuit 24 detecting currents flowing through the power FET's 3a and 3b and outputting a detection signal which has a opposite phase to that of the output signal eo of the output stage switching circuit 5.

The commonly connected collector electrodes of the transistors 21a and 21b is connected to both base electrodes of NPN transistor 25a and PNP transistor 25b and to the ground via a parallel circuit of resistor 26 (resistance value: R3) and capacitor 27. Collector electrodes of the transistors 25a and 25b are connected to positive and negative power supply terminals 28a and 28b, respectively. To the respective terminals 28a and 28b are applied positive and negative voltages +Vcc and −Vcc, and both emitter electrodes are connected to the other terminal of the resistor 14. The transistors 25a and 25b constitute an input signal limitation circuit 29 limiting an amplitude of the signal ea responding to a voltage signal eb applied to the base electrodes of the transistors 25a and 25b. And between the commonly connected drain electrodes of the power FET's 3a and 3b and the commonly connected base electrodes of the transistors 25a and 25b is connected a resistor 30 (resistance value: R4).

The operation of the circuit shown in FIG. 2 will now be described.

Firstly, the operation of the pulse-width modulation amplifier in FIG. 2 will be described. The input signal applied to the input terminal 12 is amplified by the buffer amplifier 15, and the amplified signal ea is applied to the pulse-width modulation circuit 18. The pulse-width modulation circuit 18 modulates the signal ea and outputs the pulse signal em having a duty ratio proportional to the amplitude of the signal ea. The duty ratio of the pulse signal em is set so as to be a half ($\frac{1}{2}$) when the signal ea is zero, and so that a period of high level increases as the signal ea increases in a positive direction, while a period of high level decreases as the signal ea increases in a negative direction. The pulse signal em drives the power FET's 3a and 3b, and from the commonly connected drain electrodes of the power FET's 3a and 3b is derived the large powered output pulse signal eo having an opposite phase to that of the pulse signal em. The output pulse signal eo is demodulated by the low-pass filter 8 into an analogue amplified signal analogous to the signal ea, and then applied to the loudspeaker 9.

Next, the operation of the protection circuit for the pulse-width modulation amplifier will be described. In the current detection circuit 24, the transistors 21a and 21b are voltage biased by the Zener diodes 22a and 22b and the resistor 23 so that the transistors 21a and 21b operates in Class-A mode and the D.C. voltage level of the commonly connected collector electrodes of the transistors 21a and 21b is the ground potential level.

When the signal ea increases in a positive direction and the power FET 3a becomes conductive, there is developed across the resistor 10a a voltage drop proportional to the drain current of the power FET 3a, and accordingly the potential of the commonly connected collector electrodes of the transistors 21a and 21b is lowered by the voltage drop across the resistor 10a. On the other hand, when the signal ea increases in a negative direction and the power FET 3b becomes conductive, a voltage drop proportional to the drain current of the power FET 3b, is developed across the resistor 10b and then the potential of the commonly connected collector electrodes of the transistors 21a and 21b is raised by the voltage drop across the resistor 10b. Namely, there will be appeared a pulse signal having a zero (ground) D.C. potential, a phase opposite to that of the output pulse signal eo, and an amplitude proportional to the drain currents of the power FET's 3a and 3b. The pulse signal to be appeard at the commonly connected collector electrodes of the transistors 21a and 21b is to be integrated by the capacitor 27 into an analogue signal en having an amplitude proportional to the drain currents of the power FET's 3a and 3b and a phase opposite to that of the signal ea.

The output pulse signal eo is also integrated by the resistor 30 and the capacitor 27. An analogue signal ep thus obtained by integration is to have a same phase with and to be analogous to the signal ea. However, an amplitude of the analogue signal ep decreases as the amplitude of the output pulse signal eo decreases due to abnormal circuit conditions.

The analogue signals en and ep are added together and a resultant analogue signal eb is applied to the commonly connected base electrodes of the transistors 25a and 25b. The transistors 25a and 25b limit the amplitude of the signal ea so that the magnitude of the signal ea does not increase beyond the magnitude of the signal eb+$V_{BE}$ (wherein $V_{BE}$ represents base-emitter voltages of the transistors 25a and 25b).

Hereunder, referring to the graph of the current limitation characteristics shown in FIG. 3, the operation of the protection circuit in FIG. 2 will be described more in detail. The resistance values R1, R2 and R3 of the resistors 10a, 10b, 20a, 20b and 26 are set so that the amplitude of the analogue signal en is small to the extent that the amplitude can be ignored relative to the amplitude of the signal ea when the drain current $I_D$ of the power FET's 3a and 3b is smaller than an allowable maximum drain current value $I_{DL}$, while the amplitude of the signal en is remarkably large relative to the magnitude of the signal ea when the drain current $I_D$ is greater than the allowable maximum drain current value $I_{DL}$. The resistance value R4 of the resistor 30 is set so that the amplitude of the analogue signal ep is much the same as the amplitude of the signal ea when the resistance value of the loudspeaker 9 is greater than an allowable minimum load resistance value $R_{LL}$ and the output pulse signal eo is normally obtained.

Figure 3:
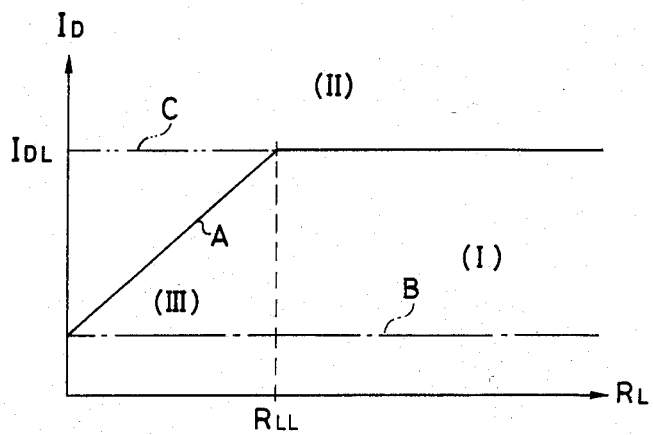
FIG. 3 is a graph showing current limitation characteristics of the protection circuit shown in FIG. 2.

In the circuit constructed as above, when the drain current $I_D$ is smaller than the value $I_{DL}$ and the resistance value $R_L$ is greater than the value $R_{LL}$ (namely, in the area (I) shown in FIG. 3), the amplitudes of the signals ep and ea are much the same and the signal en is extremely small as much as possible to be ignored. Accordingly, the magnitude of the signal eb applied to the base electrodes of the transistors 25a and 25b is determined by only the magnitude of the signal ep and is almost the same as the magnitude of the signal ea. Hence, the transistors 25a and 25b are not conductive, with the result that the amplitude limitation of the signal ea is not operable.

Next, in the condition that the drain current $I_D$ increases such that it is greater than the value $I_{DL}$ (namely, in the area (II) shown in FIG. 3), the magnitude of the signal en would become a large value as much as impossible to be ignored. Accordingly, the magnitude of the signal eb is determined by the addition of the magnitudes of the signals ep and en and is smaller than the magnitude of the signal ea. Therefore, the transistors 25a and 25b become conductive, and in detail, the transistor 25b becomes conductive to perform the amplitude limitation of the signal ea when the signal ea is positive, while the transistor 25a becomes conductive to perform the amplitude limitation when the signal ea is negative. Accordingly, the amplitude limitation of the signal ea is performed so that the amplitude of the signal ea remains not to become great beyond the amplitude of the signal eb, with the result that the condition that the drain current $I_D$ becomes greater than the value $I_{DL}$ cannot be occured at all. It should be noted here that, in such amplitude limitation operation, an output voltage of the amplifier 13 is saturated and the output impedance of the buffer amplifier 15 increase to the resistance value of the resistor 14.

And next, when the resistance value $R_L$ becomes smaller than the value $R_{LL}$ (namely, in the area (III) shown in FIG. 3), the amplitude of the signal ep decreases in response to the decrease of the output pulse signal eo and the amplitude of the signal eb becomes smaller than the amplitude of the signal ea. Accordingly, the transistors 25a and 25b becomes conductive, so that the amplitude limitation of the signal ea is performed. Under this condition, the limitation level of the drain current $I_D$ decreases abruptly as the resistance value $R_L$ decreases.

In FIG. 3, an alternate long and short dash line B expresses current limitation characteristics in the circuit of FIG. 2 in which the resistor 30 is removed, and an alternate long and two short dash line C expresses current limitation characteristics in the prior art protection circuit in which the drain current limitation is performed only based on the drain current magnitude.

As is apparent from FIG. 3, in this invention the current limitation is performed based on the output current magnitude and the output voltage magnitude, and accordingly it is possible to derive a possible maximum output power from the output stage switching circuit, and to surely limit the drain current at the time when the load resistance extremely decreases, for example, due to short-circuiting between the output terminal and the ground. Furthermore, it is unnecessary to use high speed switching transistors in the switching circuit, so that the circuit can be manufactured at relatively low cost.

It should be noted that, in the circuit shown in FIG. 2, the resistor 30 is connected between the commonly connected drain electrodes of the power FET's 3a and 3b and the commonly connected base electrodes of the transistors 25a and 25b, while such resistor 30 can be connected between the commonly connected base electrodes of the transistors 25a and 25b and the connection point of the inductor 6 and the capacitor 7 as shown in FIG. 2 by a short dashed line.

What is claimed is:

1. A protection circuit for a switching power amplifier comprising:

first detection circuit means for detecting a current flowing through an output stage switching circuit means of said amplifier and outputting a first detection signal, wherein an output signal of the output stage switching circuit means is a pulse signal amplified by said switching circuit means and said first detection signal is an analogue signal corresponding to a pulse signal representative of the current which is integrated by low-pass filter means, said analogue signal having a phase opposite to that of said output signal of the switching circuit means;

second detection circuit means for detecting an output voltage of said output stage switching circuit means and outputting a second detection signal which has an amplitude proportional to the amplitude of said output voltage and a phase opposite to the phase of said first detection signal, wherein said second detection signal is an analogue signal corresponding to the output signal of the switching circuit means integrated by low-pass filter means, said analogue signal having the same phase as that of said output signal of the switching circuit means; and amplitude limitation circuit means for limiting the amplitude of an input signal of said amplifier in response to said first and second detection signals, wherein said first detection signal operates to enhance an amplitude limitation function of said amplitude limitation circuit means, and said second detection signal operates to depress an amplitude limitation function of said amplitude limitation circuit means, whereby said first detection signal becomes dominant and a limitation level of said amplitude limitation circuit means decreases as a load resistance of said amplifier decreases, while said second detection signal becomes dominant and a limitation level of said amplitude limitation circuit means increases as the load resistance of said amplifier increases;

wherein said input signal of said amplifier is an analogue signal and has the same phase as that of said output signal of the switching circuit means, the amplifier including pulse-width modulation circuit means for pulse-width modulating said input signal of the amplifier based on a carrier signal having a constant frequency and outputting a pulse-width modulated signal having a pulse-width responsive to the amplitude of said input signal of the amplifier, said pulse-width modulated signal being applied to said output stage switching circuit means;

wherein said amplitude limitation circuit means adds said first and second detection signals, and limits the amplitude of said input signal of the pulse width modulation means in response to a resultant added signal obtained;

low-pass filter means for demodulating an output signal of said output stage switching circuit means which is an amplified pulse-width modulated signal, into an amplified analogue signal analogous to said input signal of the amplifier, said amplified analogue signal being applied to a load;

wherein said first detection circuit means comprises:

a first resistance connected between said output stage switching circuit means and power supply means; and first transistor means having a base electrode connected to said power supply means through constant voltage source means, an emitter electrode connected to a connection point of said first resistance and said output stage switching circuit means, and a collector electrode coupled to said amplitude limitation circuit means;

said first transistor means comparing a voltage appearing across said first resistor means and representing a magnitude of the current flowing through the output stage switching circuit means with a voltage appearing across said constant voltage source means, and outputting the first detection signal from the collector electrode.

2. A protection circuit for a switching power amplifier comprising:

first detection circuit means for detecting a current flowing through an output stage switching circuit means of said amplifier and outputting a first detection signal, wherein an output signal of the output stage switching circuit means is a pulse signal amplified by said switching circuit means and said first detection signal is an analogue signal corresponding to a pulse signal representative of said current which is integrated by low-pass filter means, said analogue signal having a phase opposite to that of said output signal of the switching circuit means;

second detection circuit means for detecting an output voltage of said output stage switching circuit means and outputting a second detection signal which has an amplitude proportional to the amplitude of said output voltage and a phase opposite to the phase of said first detection signal, wherein said second detection signal is an analogue signal corresponding to the output signal of the switching circuit means integrated by low-pass filter means, said analogue signal having the same phase as that of said output signal of the switching circuit means; and amplitude limitation circuit means for limiting the amplitude of an input signal of said amplifier in response to said first and second detection signals, wherein said first detection signal operates to enhance an amplitude limitation function of said amplitude limitation circuit means, and said second detection signal operates to depress an amplitude limitation function of said amplitude limitation circuit means, whereby said first detection signal becomes dominant and a limitation level of said amplitude limitation circuit means decreases as a load resistance of said amplifier decreases, while said second detection signal becomes dominant and a limitation level of said amplitude limitation circuit means increases as the load resistance of said amplifier increases;

wherein said input signal of said amplifier is an analogue signal and has the same phase as that of said output signal of the switching circuit means, the amplifier including pulse-width modulation circuit means for pulse-width modulating said input signal of the amplifier based on a carrier signal having a constant frequency and outputting a pulse-width modulated signal having a pulse-width responsive to the amplitude of said input signal of the amplifier, said pulse-width modulated signal being applied to said output stage switching circuit means;

wherein said amplitude limitation circuit means adds said first and second detection signals, and limits the amplitude of said input signal of the pulse width modulation means in response to a resultant added signal obtained;

low-pass filter means for demodulating an output signal of said output stage switching circuit means which is an amplified pulse-width modulated signal, into an amplified analogue signal analogous to said input signal of the amplifier, said amplified analogue signal being applied to a load;

wherein said first detection means comprises:

a first resistance connected between said output stage switching circuit means and positive power supply means;

first transistor means having a base electrode connected to said positive power supply means through first constant voltage source means, an emitter electrode connected to a connection point of said first resistance and said output stage switching circuit means, and a collector electrode coupled to said amplitude limitation circuit means, said first transistor means comparing a voltage appearing across said first resistance and representing a magnitude of the positive current flowing through the output stage switching circuit means with a voltage appearing across said first constant voltage source means, and outputting the first detection signal from the collector electrode; and second transistor means having a base electrode connected to said negative power supply means through second constant voltage source means, an emitter electrode connected to a connection point of said second resistance and said output stage switching circuit means, and a collector electrode coupled to said amplitude limitation circuit means, said second transistor means comparing a voltage appearing across said second resistance and representing a magnitude of the negative current flowing through the output stage switching circuit means with a voltage appearing across said second constant voltage source means, and outputting the first detection signal from the collector electrode.

3. A protection circuit for a switching power amplifier comprising:

first detection circuit means for detecting a current flowing through an output stage switching circuit means of said amplifier and outputting a first detection signal, wherein an output signal of the output stage switching circuit means is a pulse signal amplified by said switching circuit means and said first detection signal is an analogue signal corresponding to a pulse signal representative of the current which is integrated by low-pass filter means, said analogue signal having a phase opposite to that of said output signal of the switching circuit means;

second detection circuit means for detecting an output voltage of said output stage switching circuit means and outputting a second detection signal which has an amplitude proportional to the amplitude of said output voltage and a phase opposite to the phase of said first detection signal, wherein said second detection signal is an analogue signal corresponding to the output signal of the switching circuit means integrated by low-pass filter means, said analogue signal having the same phase as that of said output signal of the switching circuit means; and amplitude limitation circuit means for limiting the amplitude of an input signal of said amplifier in response to said first and second detection signals, wherein said first detection signal operates to enhance an amplitude limitation function of said amplitude limitation circuit means, and said second detection signal operates to depress an amplitude limitation function of said amplitude limitation circuit means, whereby said first detection signal becomes dominant and a limitation level of said amplitude limitation circuit means decreases as a load resistance of said amplifier decreases, while said second detection signal becomes dominant and a limitation level of said amplitude limitation circuit means increases as the load resistance of said amplifier increases;

wherein said input signal of said amplifier is an analogue signal and has a same phase as that of said output signal of the switching circuit means, the amplifier including pulse-width modulation circuit means for pulse-width modulating said input signal of the amplifier based on a carrier signal having a constant frequency and outputting a pulse-width modulated signal having a pulse-width responsive to the amplitude of said input signal of the amplifier, said pulse-width modulated signal being applied to said output stage switching circuit means;

wherein said amplitude limitation circuit means adds said first and second detection signals, and limits the amplitude of said input signal of the pulse width modulation means in response to a resultant added signal obtained;

low-pass filter means for demodulating an output signal of said output stage switching circuit means which is an amplified pulse-width modulated signal, into an amplified analogue signal analogous to said input signal of the amplifier, said amplified analogue signal being applied to a load;

wherein said amplitude limitation circuit means comprises:

third and fourth transistor means each having emitter, collector, and base electrodes;

said emitter electrodes of said third and fourth transistor means being commonly connected to an input signal terminal of said pulse-width modulation circuit means, said collector electrodes of said third and fourth transistor means being connected to positive and negative power supply means, respectively, and said base electrodes of said third and fourth transistor means being commonly connected together to receive said resultant added signal obtained by the addition of said first and second detection signals.

* * * * *